US012640705B2

(12) United States Patent
Shin et al.

(10) Patent No.: US 12,640,705 B2
(45) Date of Patent: May 26, 2026

(54) STEEP SKIRT COMBINATION MICROELECTROMECHANICAL SYSTEM CAVITY FILTER AND BULK ACOUSTIC WAVE FILTER

(71) Applicant: SKYWORKS GLOBAL PTE. LTD., Singapore (SG)

(72) Inventors: Kwang Jae Shin, Yongin (KR); Jiansong Liu, Fremont, CA (US)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 486 days.

(21) Appl. No.: 18/051,550

(22) Filed: Nov. 1, 2022

(65) Prior Publication Data

US 2023/0136934 A1      May 4, 2023

Related U.S. Application Data

(60) Provisional application No. 63/274,588, filed on Nov. 2, 2021.

(51) Int. Cl.
| | |
|---|---|
| *H03H 9/46* | (2006.01) |
| *H03H 9/54* | (2006.01) |
| *H03H 9/58* | (2006.01) |

(52) U.S. Cl.
CPC ............ *H03H 9/462* (2013.01); *H03H 9/545* (2013.01); *H03H 9/547* (2013.01); *H03H 9/585* (2013.01)

(58) Field of Classification Search
CPC ... H03H 9/02; H03H 9/54; H03H 9/64; H01P 1/20; H01P 7/06
See application file for complete search history.

(56) References Cited

U.S. PATENT DOCUMENTS

| | | | | |
|---|---|---|---|---|
| 6,975,183 B2* | 12/2005 | Aigner | ................. | H03H 9/0095 |
| | | | | 29/25.35 |
| 7,764,146 B2* | 7/2010 | Yu | .......................... | H01P 1/2084 |
| | | | | 333/204 |
| 8,410,869 B2* | 4/2013 | Omote | ................. | H03H 9/6433 |
| | | | | 333/195 |
| 10,340,874 B2* | 7/2019 | Horita | ................... | H03H 7/1775 |
| 10,340,887 B2* | 7/2019 | Takeuchi | ............. | H03H 9/6406 |
| 10,826,153 B2* | 11/2020 | Gudeman | ............... | H01P 7/065 |
| 10,931,254 B2* | 2/2021 | Cheon | ................. | H03H 9/6483 |
| 11,165,406 B2* | 11/2021 | Lin | ........................ | H03H 9/175 |
| 11,245,381 B2* | 2/2022 | Schmalzl | ............. | H03H 7/0161 |
| 11,646,760 B2* | 5/2023 | Zhang | ................. | H04B 1/0458 |
| | | | | 375/262 |
| 2017/0302243 A1* | 10/2017 | Horita | ................. | H03H 7/1758 |
| 2019/0273478 A1* | 9/2019 | Lin | ........................ | H03H 9/568 |

* cited by examiner

*Primary Examiner* — Andrea Lindgren Baltzell
*Assistant Examiner* — Alan Wong
(74) *Attorney, Agent, or Firm* — Lando & Anastasi, LLP

(57) ABSTRACT

A combination filter comprises a notch filter formed of acoustic wave resonators and a cavity filter electrically in series with the notch filter to provide for the combination filter to operate at higher powers and frequencies.

20 Claims, 21 Drawing Sheets

NOTCH FILTER WITH BAW RESONATORS

BAND PASS FILTER WITH MEMS CAVITY FILTER

NOTCH FILTER WITH
BAW RESONATORS

BAND PASS FILTER WITH
MEMS CAVITY FILTER

MEMS CAVITY
FILTER

BAW NOTCH
FILTER 1

BAW NOTCH
FILTER 2

STEEP SKIRT COMBINATION MICROELECTROMECHANICAL SYSTEM CAVITY FILTER AND BULK ACOUSTIC WAVE FILTER

CROSS-REFERENCE TO RELATED APPLICATIONS

This application claims priority under 35 U.S.C. § 119 (e) to U.S. Provisional Patent Application Ser. No. 63/274,588, titled "STEEP SKIRT COMBINATION MICROELEC-TROMECHANICAL SYSTEM CAVITY FILTER AND BULK ACOUSTIC WAVE FILTER," filed Nov. 2, 2021, the entire contents of which is incorporated herein by reference for all purposes.

BACKGROUND

Field

Aspects and embodiments disclosed herein relate to pass-band filters, such as for use in radio-frequency front end (RFFE) modules. Aspects and embodiments disclosed herein also relate to radio-frequency (RF) modules and wireless devices comprising passband filters.

Description of the Related Technology

Acoustic wave devices may be utilized as components of filters in radio frequency electronic systems. For instance, filters in a radio frequency front end of a mobile phone can include acoustic wave filters. Filters include passband filters. The acoustic wave devices that comprise a filter affect its performance and the range of frequencies in which it can operate.

A type of acoustic wave device commonly used in pass-band filters is a bulk acoustic wave resonator (BAW). This type of resonator has a robust structure and may be formed using well-known processes.

Another form of filter that is operable at high frequencies is a cavity filter. A cavity filter has a resonant frequency that is determine by the geometry of the cavity or cavities included in the filter.

With the advent of 5G New Radio (5G NR), new fre-quency ranges have been opened up for use, including Frequency Range 1 (FR1) between approximately 0.4 and 7.1 GHZ and Frequency Range 2 (FR2) which spans approximately the range 24 GHz to 53 GHZ. New filters are desired that are adapted to work at these frequency ranges, as well as filters that produce a cleaner, better quality signal.

SUMMARY

In accordance with one aspect, there is provided a com-bination filter. The combination filter comprises a notch filter formed of acoustic wave resonators and a cavity filter electrically in series with the notch filter to provide for the combination filter to operate at higher powers and frequen-cies.

In some embodiments, the notch filter is formed of bulk acoustic wave resonators.

In some embodiments, the bulk acoustic resonators include piezoelectric films having multiple sub-layers hav-ing different crystallographic orientations that provide for the bulk acoustic resonators to operate in one of a second overtone mode or a third overtone mode.

In some embodiments, the bulk acoustic resonators include piezoelectric films having two sub-layers having different crystallographic orientations.

In some embodiments, the bulk acoustic resonators include piezoelectric films having four sub-layers, adjacent ones of the four sub-layers having different crystallographic orientations.

In some embodiments, the notch filter is formed of lamb wave resonators.

In some embodiments, the cavity filter is a microelectro-mechanical system cavity filter.

In some embodiments, an upper end of a stopband of the notch filter is aligned with a lower end of a passband of the cavity filter.

In some embodiments, a lower end of a stopband of the notch filter is aligned with an upper end of a passband of the cavity filter.

In some embodiments, the notch filter is a first notch filter and the combination filter further comprises a second notch filter in series with the first notch filter and cavity filter.

In some embodiments, an upper end of a stopband of the first notch filter is aligned with a lower end of a passband of the cavity filter and a lower end of a stopband of the second notch filter is aligned with an upper end of the passband of the cavity filter.

In some embodiments, the combination filter has an operating frequency between about 0.4 and about 7.1 GHz.

In some embodiments, the combination filter has an operating frequency between about 24 GHz and about 53 GHz.

In some embodiments, the combination filter exhibits a steeper skirt than the cavity filter alone.

In some embodiments, the combination filter exhibits a greater power handling ability at a given frequency than a ladder filter formed of acoustic wave resonators operating at the given frequency.

In some embodiments, the combination filter is included in a radio frequency front end module.

In some embodiments, the radio frequency front end module of claim has an operating frequency within one of the 5G FR1 band or the 5G FR2 band.

In some embodiments, the radio frequency front end module is included in an electronic device.

In some embodiments, the radio frequency front end module is included in a cellular telephone.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Exemplary aspects and embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment," or the like are not necessarily mutually exclusive and are intended to indicate that a particular feature, structure, or characteristic described may be included in at least one embodiment. The appearances of such terms herein are not necessarily all referring to the same embodiment.

Aspects and embodiments described herein are directed to a passband filter, such as for use in radio-frequency (RF) implementations including, for example, radio-frequency front end (RFFE) modules, having a steep skirt and able to operate at higher frequencies with better power handling than many conventional radio frequency filters.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1A:
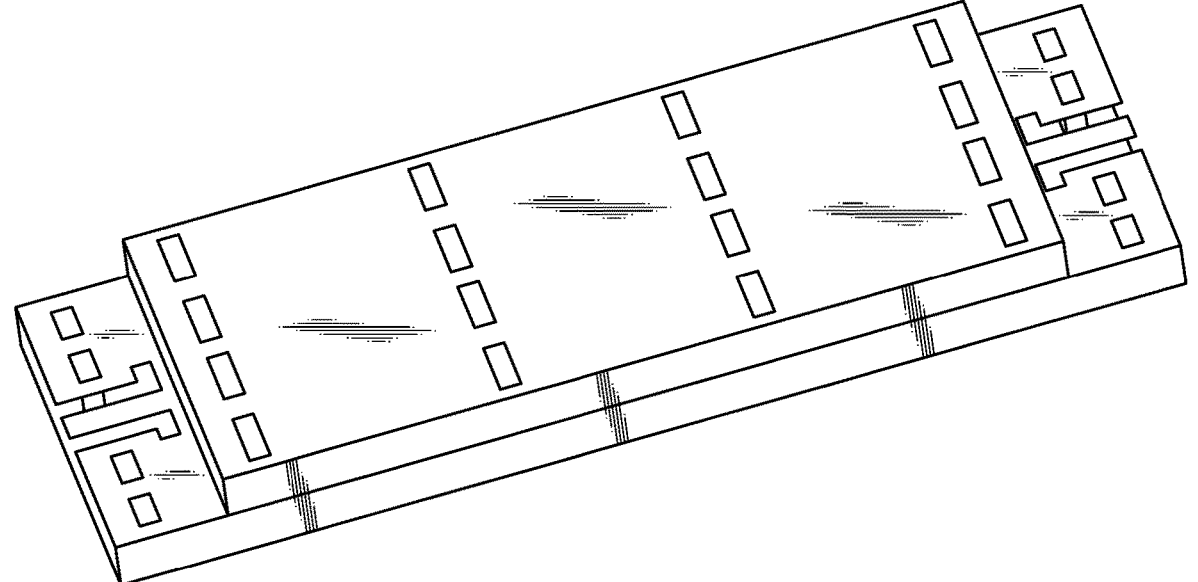
FIG. 1A illustrates an example of a microelectromechani-cal system (MEMS) cavity filter.
Figure 1B:
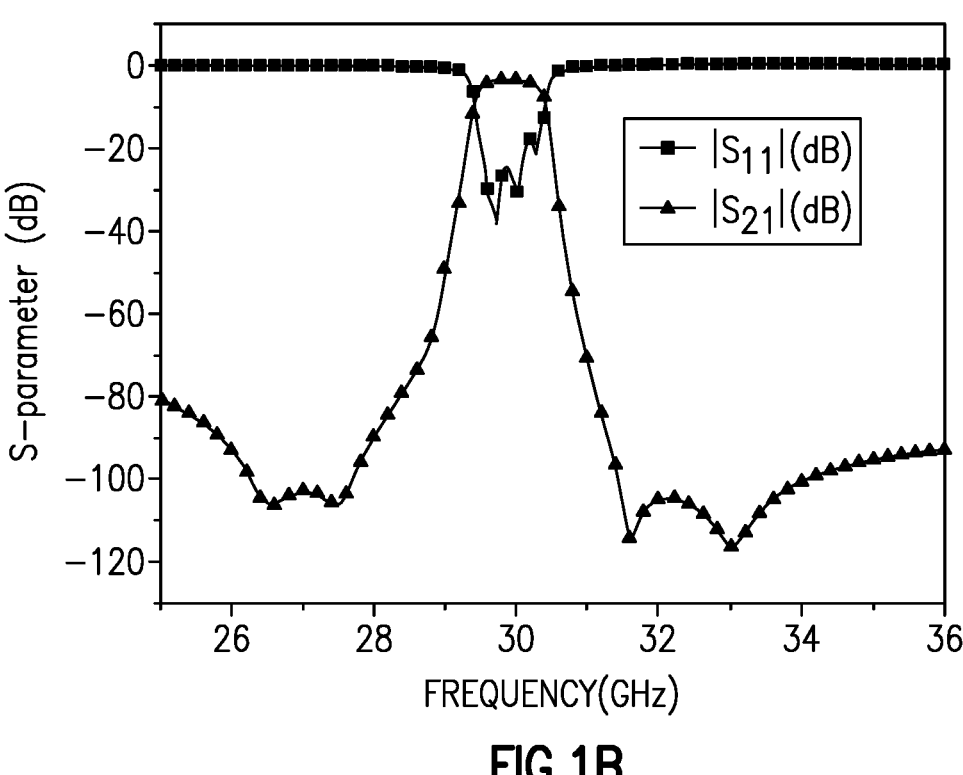
FIG. 1B illustrates the transmitted and returned power versus frequency curves for an example of a MEMS cavity filter.
Figure 1C:
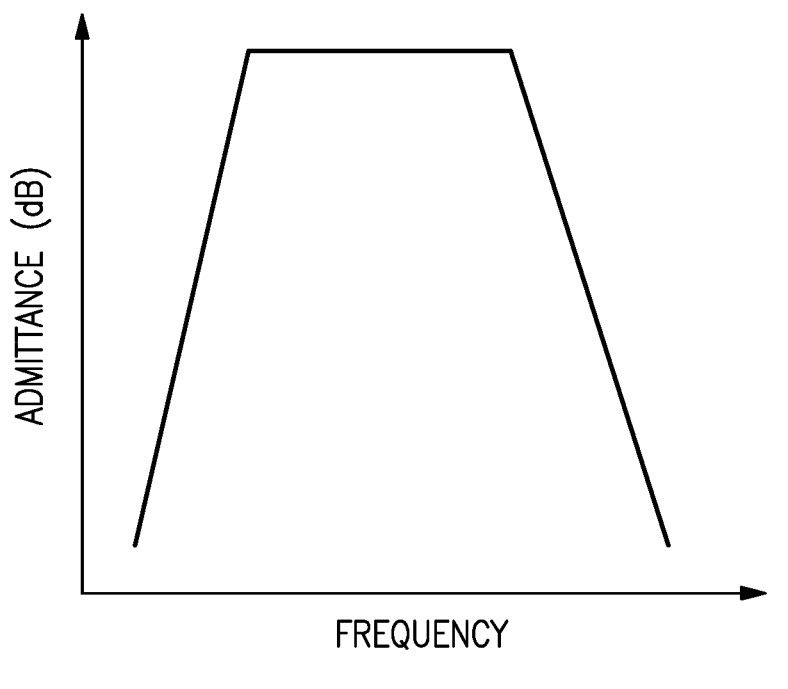
FIG. 1C is a simplified illustration of the shape of an admittance versus frequency curve for an example of MEMS cavity filter.

A number of different filter architectures capable of filtering radio-frequency signals are known in the art. Different filter architectures have different advantages and disadvantages. One type of filter architecture capable of filtering radio-frequency signals is a cavity filter. Cavity filters, or more specifically for the purposes of this disclosure, microelectromechanical system (MEMS) cavity filters can operate at very high frequencies at high power with little insertion loss. One example of a MEMS cavity filter, as described in *MEMS Bandpass Filter Based On Substrate Integrated Waveguide Structure*, Ze-hua Cao et al., Fundamental Science on EHF Laboratory, University of Electronic Science and Technology of China, is illustrated in FIG. 1A. Examples of MEMS cavity filters are capable of handling higher power signals without damage than many other filter types. A disadvantage of MEMS cavity filters is that their rejection performance out of band, or away from their resonance frequency is not as good as many other types of RF filters because MEMS cavity filters exhibit resonance but not anti-resonance. The frequency response of an example of a MEMS cavity filter is illustrated in FIG. 1B, showing the transmitted power $S_{21}$ curve and the returned power $S_{11}$ curve. The transmitted power (admittance) curve is shown more schematically in FIG. 1C. The admittance of the cavity filter falls off gradually on either side of the passband, making it difficult to operate the cavity filter to pass only a narrow range of frequencies. The cavity filter can be described as having a wide skirt, where the term "skirt" refers to the drop in admittance on either side of the passband or resonant frequency of the filter.

Figure 2A:
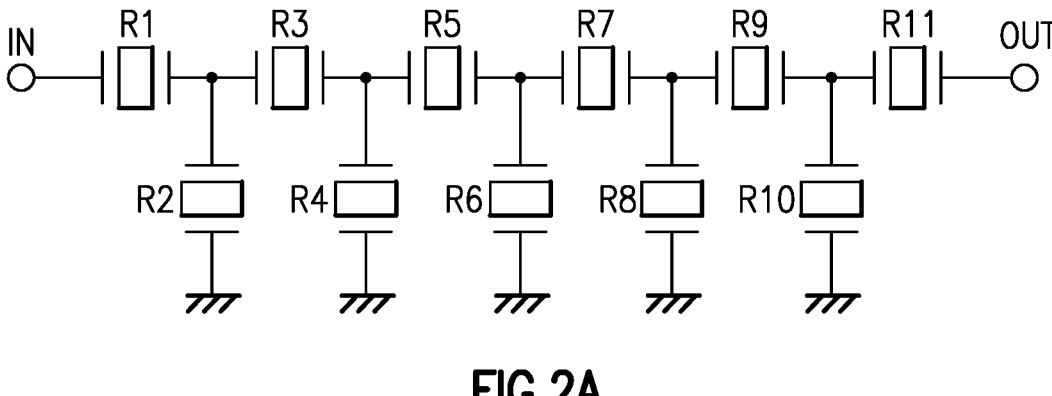
FIG. 2A is a schematic diagram of an example of a ladder filter.

Another type of filter for RF signals may be formed from acoustic wave resonators. One type of acoustic wave resonator-based RF filter is known as a ladder filter. One example of a ladder filter is illustrated in FIG. 2A. The filter of FIG. 2A includes a plurality of resonators R1, R2, R3, R4, R5, R6, R7, R8, R9, R10, and R11. Resonators R1, R3, R5, R7, R9, and R11 are connected in series between the input port (IN) and the output port (OUT). Resonators R2, R4, R6, R8, and R10 are connected between adjacent pairs of resonators R1, R3, R5, R7, R9, and R11 and ground. Resonators R2, R4, R6, R8, and R10 may also be referred to as shunt resonators. In some embodiments, each of the series resonators R1, R3, R5, R7, R9, and R11 may have the same resonant frequency. Each of the plurality of shunt resonators R2, R4, R6, R8, and R10 have a resonant frequency below the resonant frequency of each of the series arm resonators R1, R3, R5, R7, R9, and R11. At least one of the plurality of shunt resonators R2, R4, R6, R8, and R10 may have a first resonant frequency different from resonant frequencies of others of the plurality of shunt resonators. At least one of the plurality of shunt resonators R2, R4, R6, R8, and R10 may have a second resonant frequency different from the first resonant frequency and different from the resonant frequencies of others of the plurality of shunt resonators.

Figure 2B:
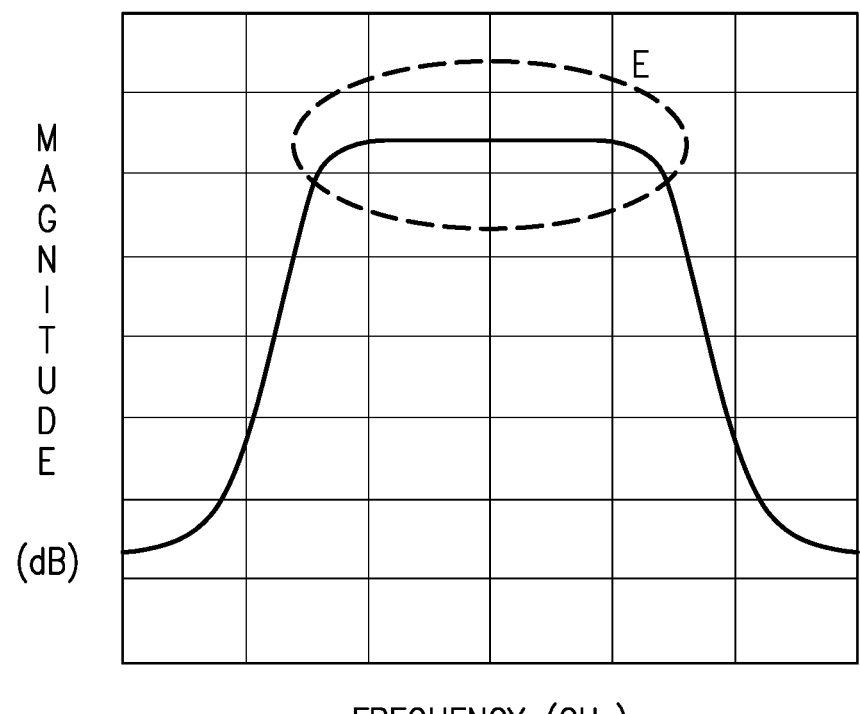
FIG. 2B is a simplified illustration of the shape of an admittance versus frequency curve for the ladder filter of FIG. 2A.

Filters having an architecture similar to that illustrated in FIG. 2A may act as passband filters, and are often provided in radio-frequency front end (RFFE) modules. Such a passband filter has a frequency response as illustrated in FIG. 2B in which the passband is indicated by the frequency range in the circled area "E". The filter allows a range of frequencies through, with signals having frequencies outside of this range being suppressed. The series resonators R1, R3, R5, R7, R9, and R11 define the upper frequency limit of the passband filter, while the shunt resonators R2, R4, R6, R8, and R10 define the lower frequency limit.

Ladder filters as illustrated in FIG. 2A may be formed from acoustic wave resonators including surface acoustic wave (SAW) resonators or bulk acoustic wave (BAW) resonators. Such ladder filters may exhibit certain disadvantages making them less than ideal for operating at frequencies and power ratings desired for 5G devices. The frequency at which SAW resonators may operate is determined in part by how closely the electrodes of the SAW resonators may be spaced from one another. A closer spacing of electrodes provides for a SAW filter to operate at a higher resonant and anti-resonant frequency. However, as the spacing between electrodes becomes smaller, a SAW resonator generally becomes less robust for operating with high power signals because the higher the power the signal is, the more likely that arcing may occur across closely spaced electrodes. A ladder filter formed of SAW resonators thus may have difficulty operating at both high frequencies and high power. A ladder filter formed of BAW resonators may exhibit similar disadvantages. In BAW resonators the frequency at which BAW resonators may operate is determined in part by how thin the piezoelectric film of the BAW resonator may be formed. A thinner piezoelectric film layer generally provides for a BAW to operate at a higher resonant and anti-resonant frequency. However, as the thickness of the piezoelectric film layer becomes smaller, a BAW generally becomes less robust for operating with high power signals because the higher the power the signal is, the more likely that arcing may occur through the piezoelectric film layer. A ladder filter formed of BAW resonators thus may have difficulty operating at both high frequencies and high power.

Figure 3A:
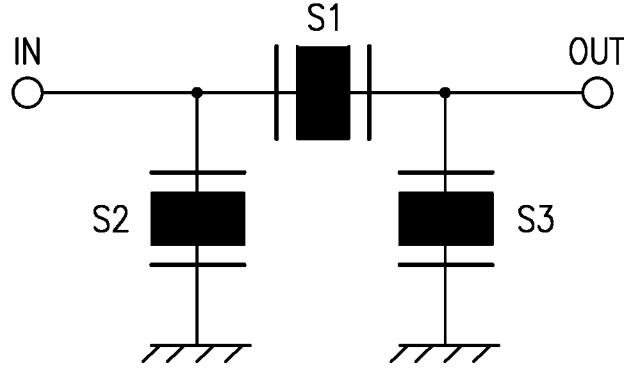
FIG. 3A is a schematic diagram of a notch filter.

Acoustic wave resonators may also be arranged as a notch filter which may be considered the opposite of a passband filter. Rather than defining a passband, a notch filter defines a frequency region in which a radio frequency signal is attenuated. One example arrangement of acoustic wave resonators forming a notch filter is illustrated in FIG. 3A. The notch filter includes a series resonator S1 and shunt resonators S2, S3 coupled between the input and output sides of the series resonator S1 and ground. The frequency response of the notch filter is exhibited schematically in FIG. 3B.

Figure 4:
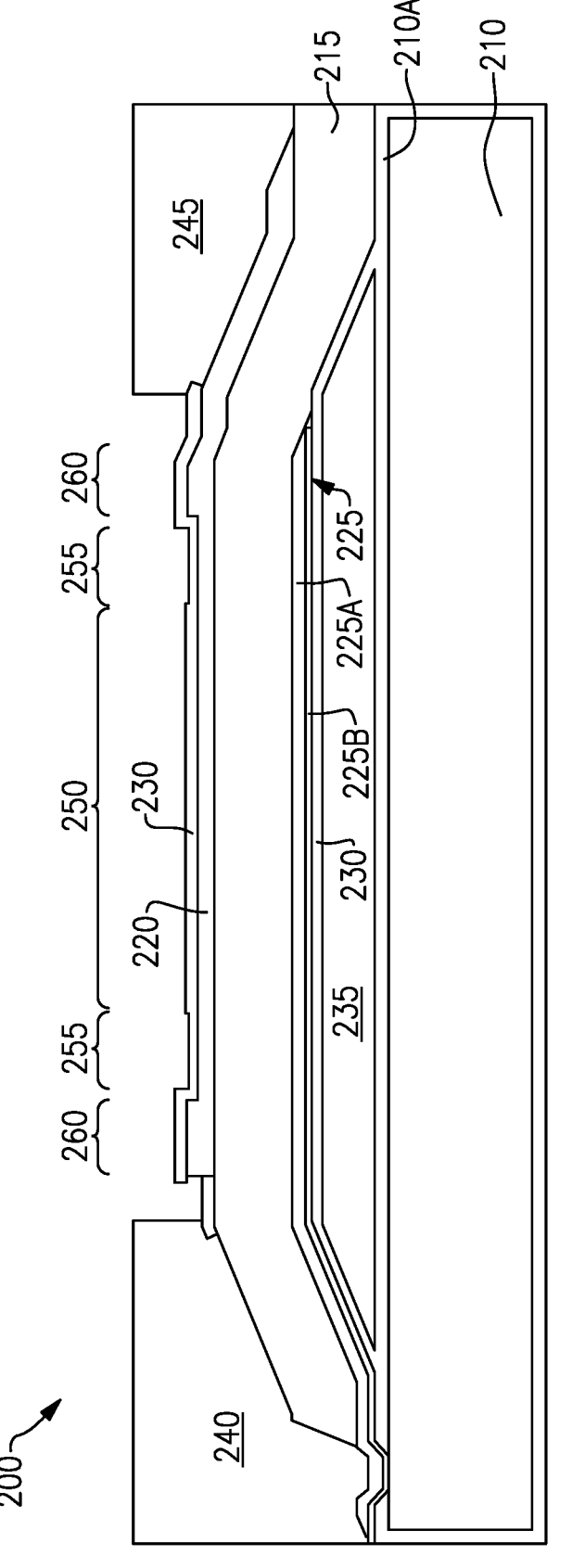
FIG. 4 is a cross-sectional diagram of a bulk acoustic wave resonator (BAW)

As discussed above one type of acoustic wave resonator that may be used to form an acoustic wave filter is a BAW. FIG. 4 is cross-sectional view of an example of a BAW, indicated generally at 200, specifically a film bulk acoustic wave resonator (FBAR). The BAW 200 is disposed on a substrate 210, for example, a silicon substrate that may include a dielectric surface layer 210A of, for example, silicon dioxide. The BAW 200 includes a layer or film of piezoelectric material 215, for example, aluminum nitride (AlN). A top electrode 220 is disposed on top of a portion of the layer or film of piezoelectric material 215 and a bottom electrode 225 is disposed on the bottom of a portion of the layer or film of piezoelectric material 215. The top electrode 220 may be formed of, for example, ruthenium (Ru). The bottom electrode 225 may include a layer 225A of Ru disposed in contact with the bottom of the portion of the layer or film of piezoelectric material 215 and a layer 225B of titanium (Ti) disposed on a lower side of the layer 225A of Ru opposite a side of the layer 225A of Ru in contact with the bottom of the portion of the layer or film of piezoelectric material 215. Each of the top electrode 220 and the bottom electrode 225 may be covered with a layer of dielectric material 230, for example, silicon dioxide. An air cavity 235 is defined beneath the layer of dielectric material 230 covering the bottom electrode 225 and the surface layer 210A of the substrate 210. A bottom electrical contact 240 formed of, for example, copper may make electrical connection with the bottom electrode 225 and a top electrical contact 245 formed of, for example, copper may make electrical connection with the top electrode 220.

The BAW 200 may include a central region 250 including a main active domain in the layer or film of piezoelectric material 215 in which a main acoustic wave is excited during operation. A recessed frame region or regions 255 may bound and define the lateral extent of the central region 250. The recessed frame region(s) 255 may be defined by areas that have a thinner layer of dielectric material 230 on top of the top electrode 220 than in the central region 250. The dielectric material layer 230 in the recessed frame region(s) 255 may be from about 10 nm to about 200 nm thinner than the dielectric material layer 230 in the central region 250 and/or the difference in thickness of the dielectric material in the recessed frame region(s) 255 vs. in the central region 250 may cause the resonant frequency of the device in the recessed frame region(s) 255 to be between about 5 MHz to about 50 MHz higher than the resonant frequency of the device in the central region 250. A raised frame region or regions 260 may be defined on an opposite side of the recessed frame region(s) 255 from the central region 250 and may directly abut the outside edge(s) of the recessed frame region(s) 255. The raised frame region(s) 260 may be defined by areas where the top electrode 220 is thicker than in the central region 250 and in the recessed frame region(s) 255. The top electrode 220 may have the same thickness in the central region 250 and in the recessed frame region(s) 255 but a greater thickness in the raised frame region(s) 260. The top electrode 220 may be between about 50 nm and about 500 nm thicker in the raised frame region(s) 260 than in the central region 250 and/or in the recessed frame region(s) 255. The raised frame region(s) may be, for example, 1 μm or more in width.

The recessed frame region(s) 255 and the raised frame region(s) 260 may contribute to dissipation or scattering of transverse acoustic waves generated in the BAW 200 during operation and/or may reflect transverse waves propagating outside of the recessed frame region(s) 255 and the raised frame region(s) 260 and prevent these transverse acoustic waves from entering the central region and inducing spurious signals in the main active domain region of the BAW. Without being bound to a particular theory, it is believed that due to the thinner layer of dielectric material 230 on top of the top electrode 220 in the recessed frame region(s) 255, the recessed frame region(s) 255 may exhibit a higher velocity of propagation of acoustic waves than the central region 250. Conversely, due to the increased thickness and mass of the top electrode 220 in the raised frame region(s) 260, the raised frame regions(s) 260 may exhibit a lower velocity of propagation of acoustic waves than the central region 250 and a lower velocity of propagation of acoustic waves than the recessed frame region(s) 255. The discontinuity in acoustic wave velocity between the recessed frame region(s) 255 and the raised frame region(s) 260 creates a barrier that scatters, suppresses, and/or reflects transverse acoustic waves.

Figure 5:
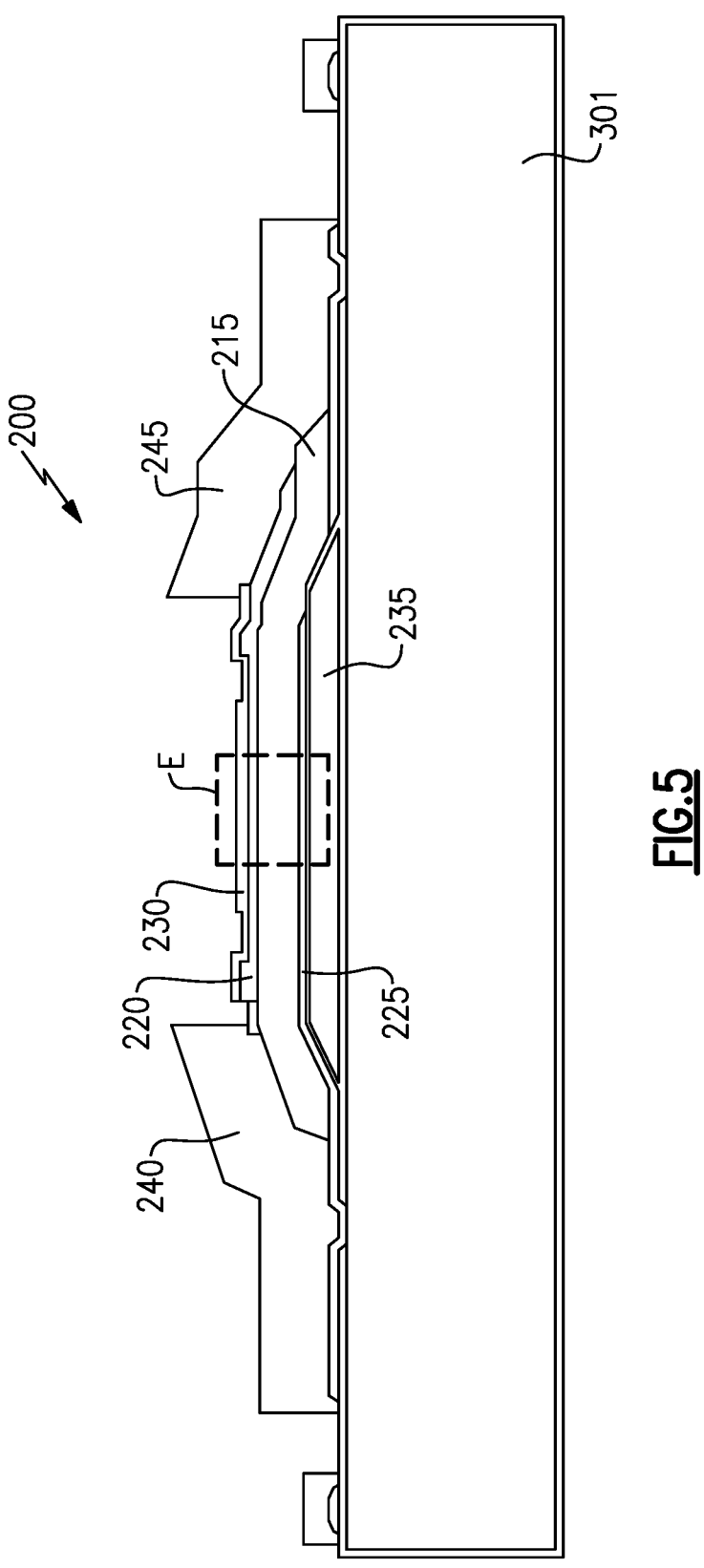
FIG. 5 is a cross-sectional diagram of a BAW identifying a portion of the active region of the BAW.

FIG. 5 illustrates a BAW 200 that is generally the same as that discussed in relation to FIG. 4, and is mounted on a substrate 301, such as a silicon wafer, and comprises a top electrode 220 and a bottom electrode 225 disposed either side of piezoelectric layer 215. The BAW further comprises a cavity 235 and has a layer of dielectric material 230 disposed over the top electrode 220. The difference of the BAW 200 of FIG. 5 compared to that of FIG. 4 will be discussed in relation to FIGS. 6A-10.

Figure 6A:
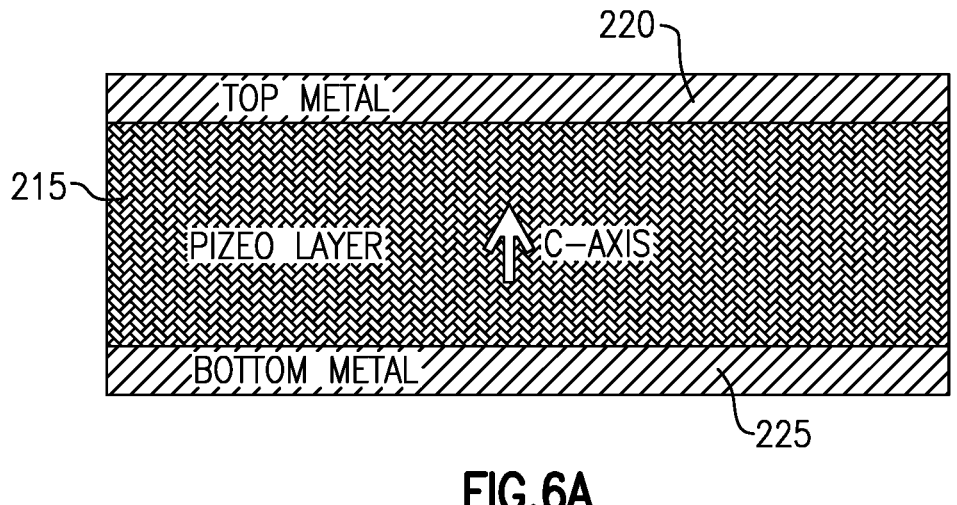
FIG. 6A illustrates an example of an electrode and piezoelectric film stack that may be present within the region of the BAW identified in FIG. 5 that causes the BAW to operate in a thickness extension mode.
Figure 6B:
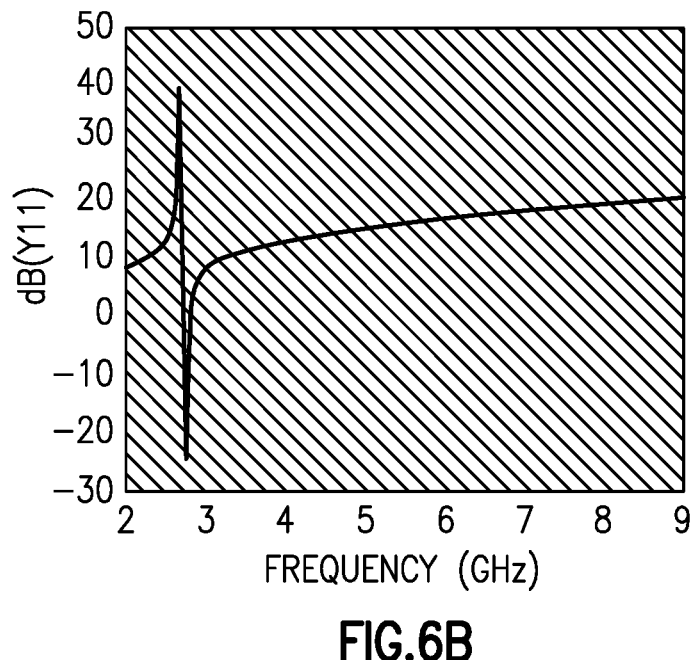
FIG. 6B illustrates an example of the frequency response of a BAW operating in a thickness extension mode.

FIG. 6A illustrates the region of box E in FIG. 5 that may be provided in a conventional BAW such as illustrated in FIG. 4. It comprises a single piezoelectric layer 215, bounded by a top electrode 220 and a bottom electrode 225. FIG. 6B illustrates the frequency response of such a device. The y-axis of FIG. 6B represents the admittance of the 1-port resonator, while the x-axis represents frequency. As can be seen, the resonant frequency lies between 2 GHZ and 3 GHZ (for the selected thickness of the piezoelectric layer 215). Such a mode of operation is known as a thickness extension (TE) mode.

Figure 7A:
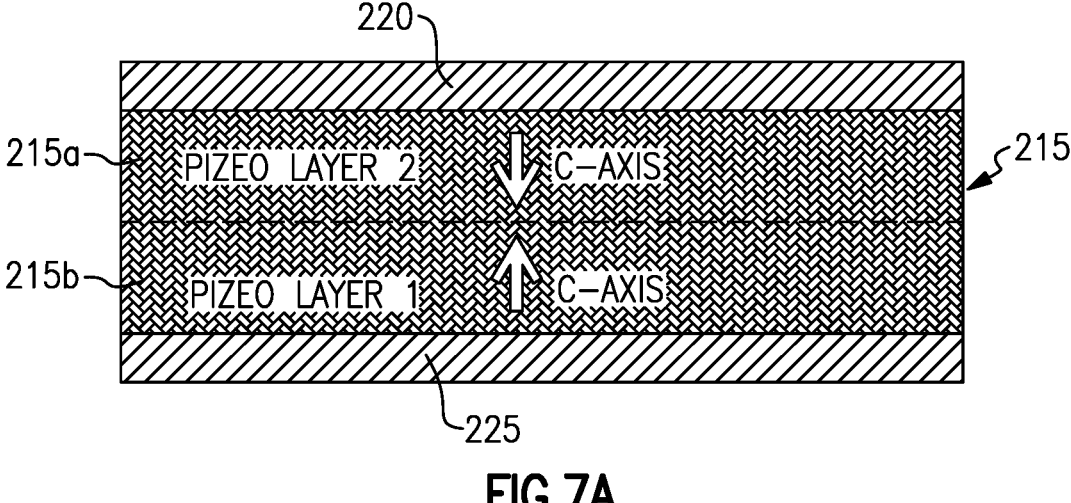
FIG. 7A illustrates an example of an electrode and piezoelectric film stack including a multilayer piezoelectric film that may be present within the region of the BAW identified in FIG. 5 that causes the BAW to operate in a second overtone mode.
Figure 7B:
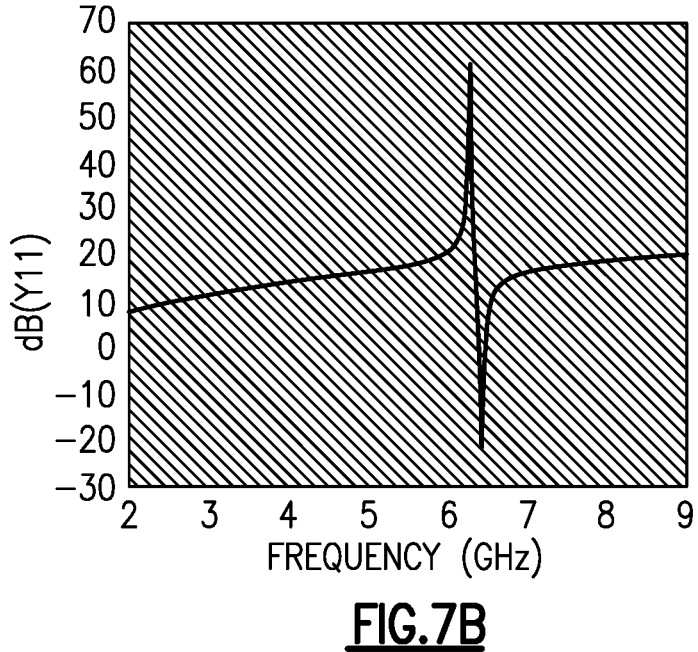
FIG. 7B illustrates an example of the frequency response of a BAW operating in a second overtone mode.

FIG. 7A illustrates a variation whereby the piezoelectric layer 215 is divided into two sub-layers 215a, 215b. The layers are distinguished by having different polarizations, as illustrated in the example of FIG. 7A wherein the piezoelectric layers are AlN layers having different orientations of the crystallographic C-axis, the glide plane in the c-direction to the normal of the crystal structure, in each sub-layer 215a, 215b. Looking at the graph of FIG. 7B, the effect of dividing the piezoelectric layer 215 into two sub-layers 215a, 215b is apparent. The resonant frequency, for the same total thickness of the piezoelectric layer 215 as in a BAW having the piezoelectric film structure 215 illustrated in FIG. 6A, is greatly increased, now lying between 6 GHz and 7 GHz. Such a mode of operation is known as an overtone mode, specifically the second overtone mode. In this manner, by utilizing the overtone mode by having two (or more) layers of piezoelectric material with different polarizations, a BAW can be provided to operate at a higher frequency region than a BAW having a homogeneous single piezoelectric film layer.

Figure 8A:
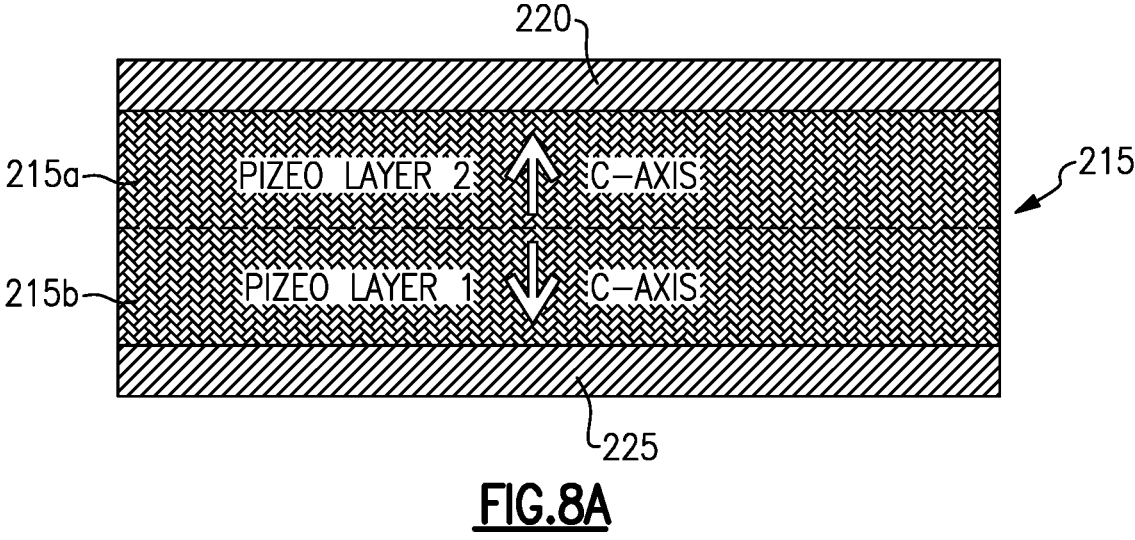
FIG. 8A illustrates another example of an electrode and piezoelectric film stack including a multilayer piezoelectric film that may be present within the region of the BAW identified in FIG. 5 that causes the BAW to operate in a second overtone mode.
Figure 8B:
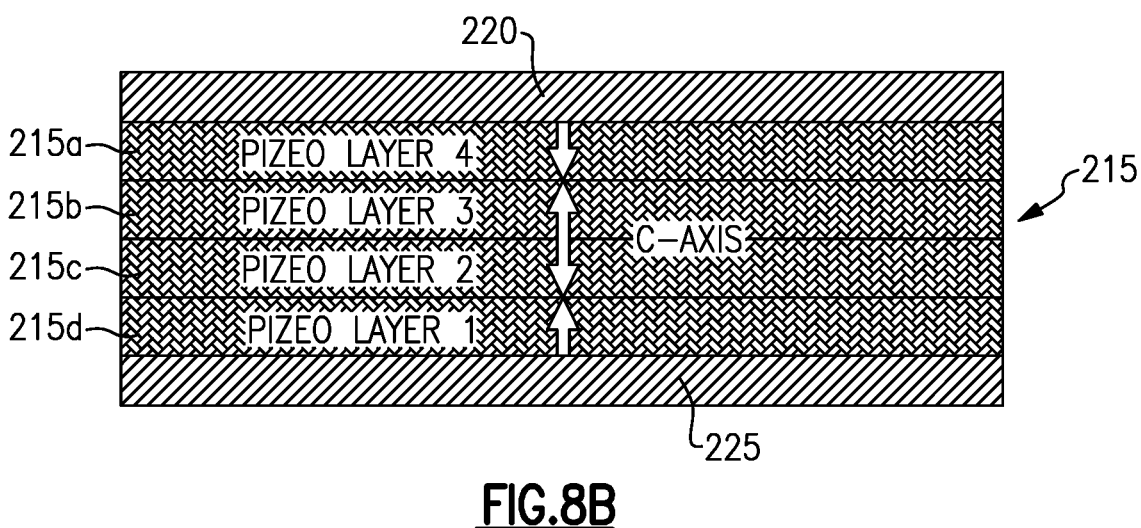
FIG. 8B illustrates another example of an electrode and piezoelectric film stack including a multilayer piezoelectric film that may be present within the region of the BAW identified in FIG. 5 that causes the BAW to operate in a second overtone mode.

FIGS. 8A and 8B illustrate additional configurations of the piezoelectric layers in a BAW as illustrated in FIG. 5 that may cause the BAW to operate in a second overtone mode. In FIG. 8A, the C axes of the two sub-layers 215a, 215b are oriented opposite to the orientation illustrated in FIG. 7A. In FIG. 8B, the piezoelectric layer is split into four sublayers 215a-215d, with adjacent sublayers having opposite C-axis orientations.

Figure 9A:
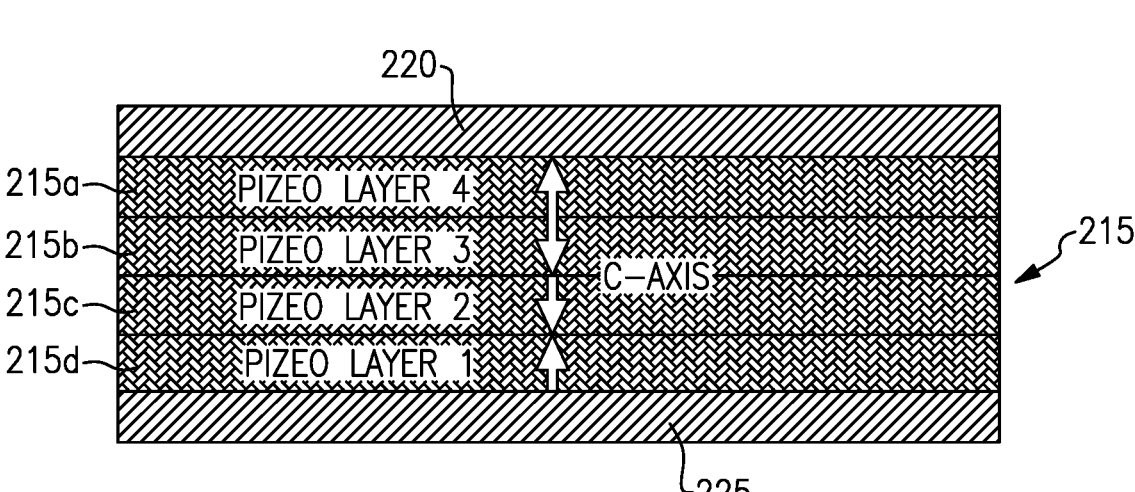
FIG. 9A illustrates an example of an electrode and piezoelectric film stack including a multilayer piezoelectric film that may be present within the region of the BAW identified in FIG. 5 that causes the BAW to operate in a third overtone mode.
Figure 9B:
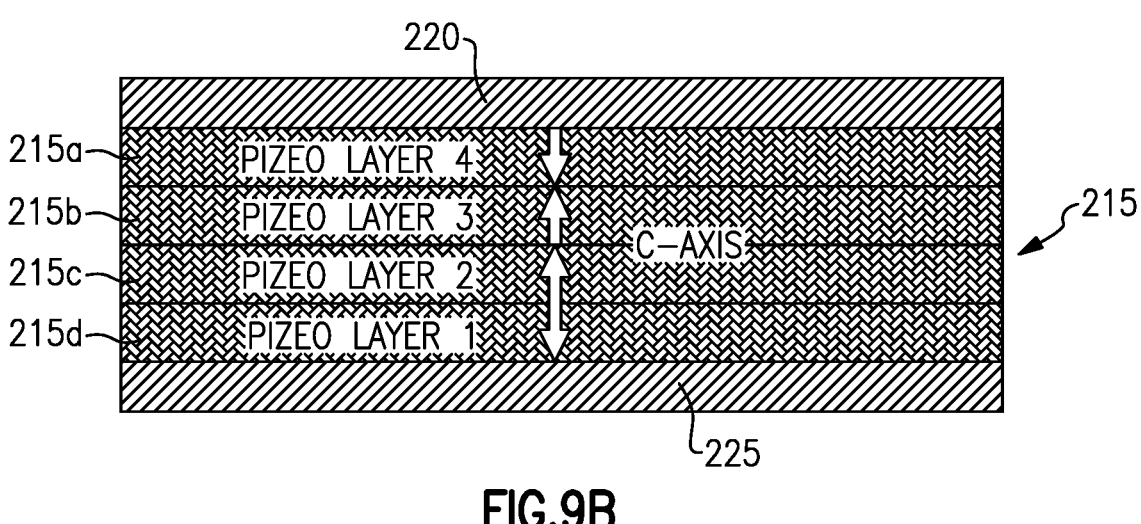
FIG. 9B illustrates another example of an electrode and piezoelectric film stack including a multilayer piezoelectric film that may be present within the region of the BAW identified in FIG. 5 that causes the BAW to operate in a third overtone mode.
Figure 9C:
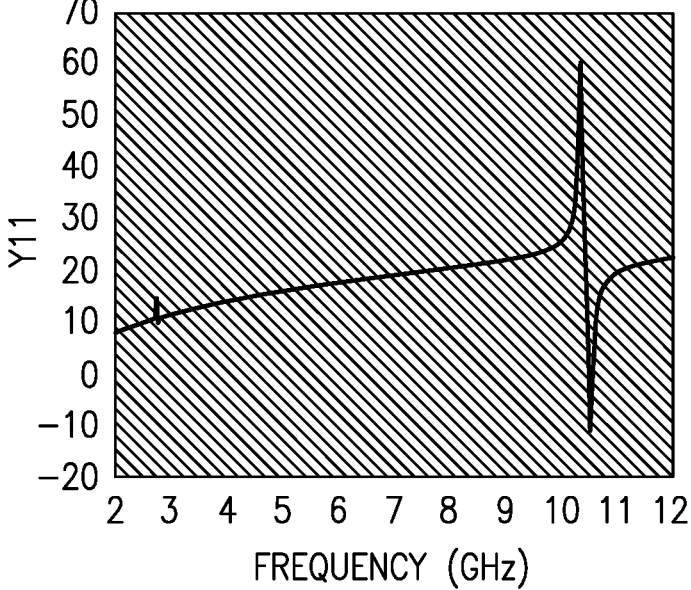
FIG. 9C illustrates an example of the frequency response of a BAW operating in a third overtone mode.

The piezoelectric film of a BAW can also be split into sub-layers with C-axis orientations that cause the BAW to operate in a third overtone mode. FIGS. 9A and 9B illustrate BAW piezoelectric layer structures 215 each broken into four sublayers 215a-215d, with the C-axis orientation of each sublayer being opposite to the C-axis orientation of an adjacent sublayer. FIG. 9C illustrates the admittance curve of an example BAW operating in the third overtone mode. The resonant frequency, for the same total thickness of the piezoelectric layer 215 as in a BAW having the piezoelectric film structure 215 illustrated in FIG. 6A, is greatly increased over that of BAWS operating in either the thickness extension mode or the second overtone mode, now lying between 10 GHz and 11 GHZ.

BAW resonators can thus be operated at very high frequencies when utilizing overtone modes of operation. One advantage of BAW resonators over cavity resonators is that they can be used to form a filter having a passband with a sharp skirt because BAW resonators exhibit both resonant and antiresonant frequencies which can be utilized to define the upper and lower ends of a passband of a filter including BAW resonators. BAW resonators can also generally be made smaller than cavity resonators for the same resonant frequency. A disadvantage of BAW resonators as compared to cavity resonators is that they may exhibit higher insertion loss when operating in overtone mode than a cavity filter operating in the same frequency range. Also, as discussed above, BAW resonators are generally less capable of handling high power signals at high frequencies due to the reduction in thickness of the piezoelectric film between the electrodes of the resonator that may be used to increase the operating frequency. A thinner piezoelectric layer may lead to a higher operating frequency of a BAW, but a greater possibility of electrical breakdown across the electrodes and through the piezoelectric film. There is also a limit to how high the operating frequency of a BAW may be made due to limits in reliability when utilizing very thin piezoelectric films. Further, the electromagnetic coupling coefficient $k^2$ decreases with decreasing film thickness which causes the bandwidth of a filter formed of BAWs operating at high frequencies to be narrow.

Another form of acoustic wave resonator is a Lamb wave resonator. A Lamb wave resonator is also a type of bulk acoustic wave resonator. Lamb wave resonators can operate at higher frequency than film bulk acoustic wave resonators (FBARs), because they typically do not rely only a thin film of piezoelectric material to define their operating frequencies, and they can handle higher powers. Furthermore, they typically exhibit a higher $k^2$ than FBARs. However, Lamb wave resonators are a more complex design to manufacture than FBARs using current manufacturing processes.

Figure 10A:
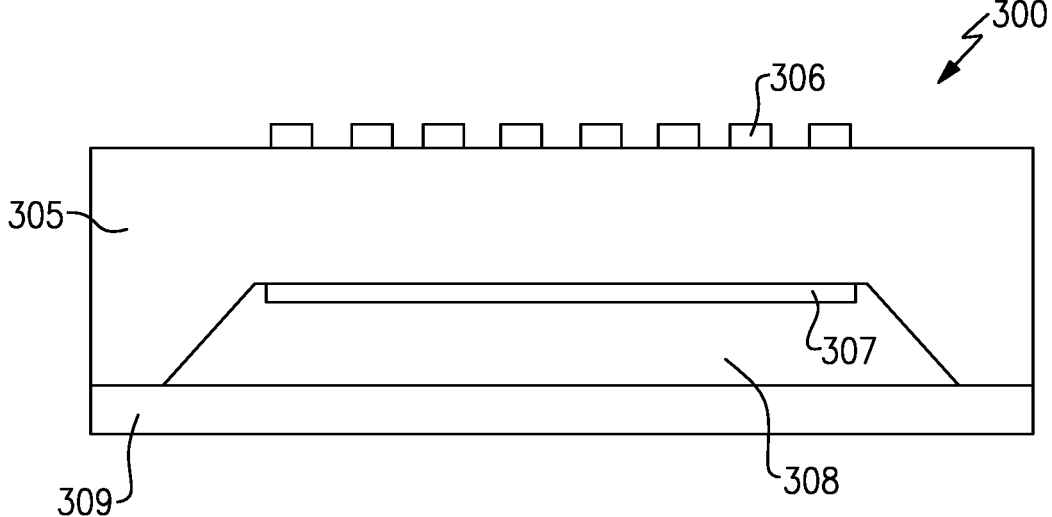
FIG. 10A is a cross-sectional diagram of an example of a Lamb wave resonator.

FIG. 10A is a cross-sectional diagram of a Lamb wave resonator 300. The Lamb wave resonator 300 is implemented on a substrate 309. The Lamb wave resonator 300 includes a piezoelectric layer 305, an interdigital transducer electrode (IDT) electrode 306 on the piezoelectric layer 305, and a lower electrode 307. The piezoelectric layer 305 can be a thin film. The piezoelectric layer 305 can be an aluminum nitride (AlN) layer. In other instances, the piezoelectric layer 305 can be any suitable piezoelectric layer. For example, the piezoelectric layer 305 can be a lithium niobate layer (LiNbO$_3$) or a lithium tantalate (LiTaO$_3$) layer. The operating frequency of the Lamb wave resonator 300 can be based on the geometry of the IDT electrode 306. In some instances, the illustrated IDTs of the Lamb wave resonator 300 represent two sets of IDTs. The lower electrode 307 can be grounded in certain instances. In some other instances, the lower electrode 307 can be floating. An air cavity 308 is disposed between the lower electrode 307 and the substrate 309. Any suitable cavity can be implemented in place of the air cavity 308. The substrate 309 can be a semiconductor substrate. For example, the substrate 309 can be a silicon substrate. The substrate 309 can be any other suitable substrate, such as a quartz substrate, a sapphire substrate, or a spinel substrate.

Figure 10B:
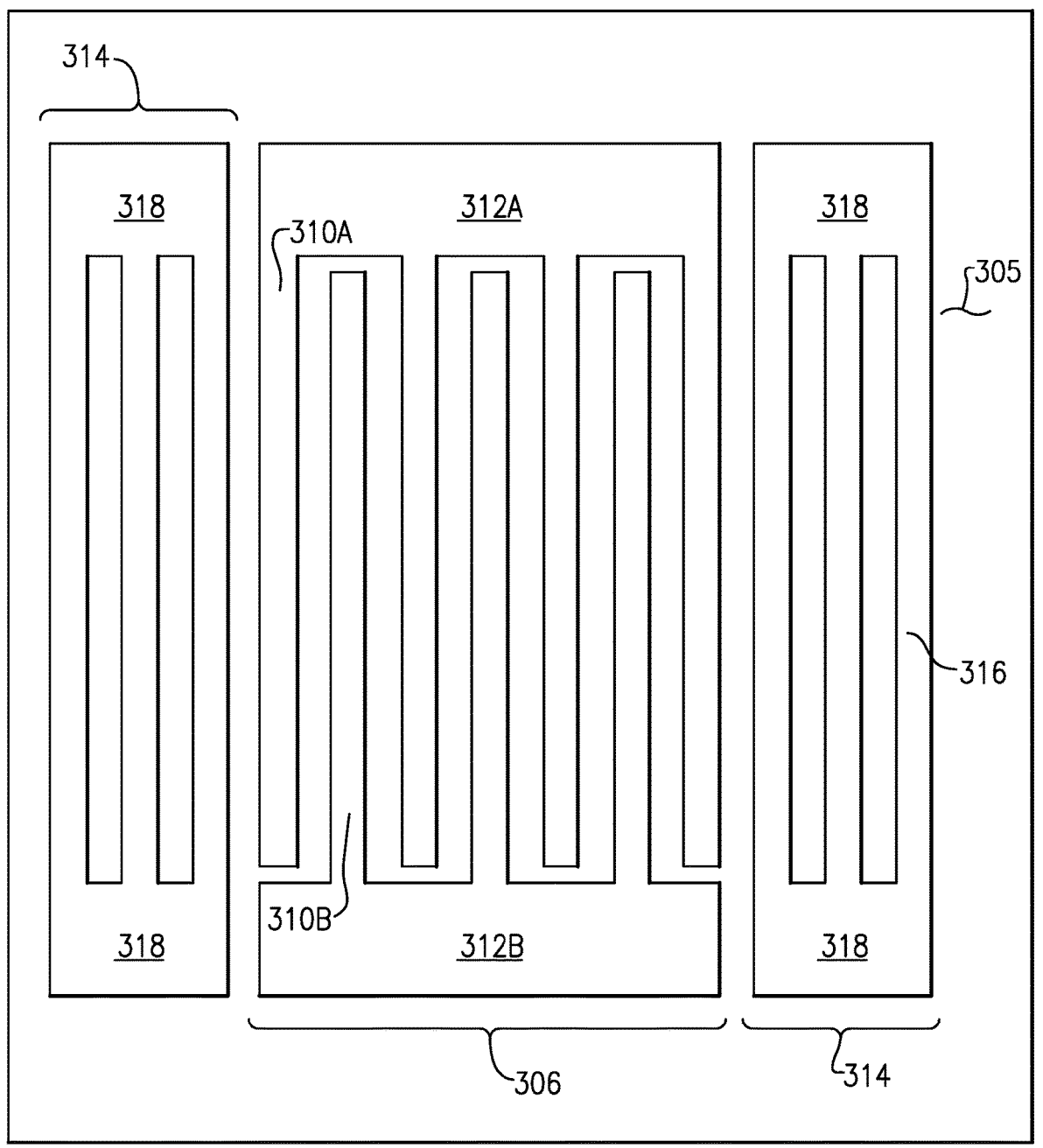
FIG. 10B illustrates an example of an interdigital electrode structure that may be included in an example of a Lamb wave resonator.
Figure 10C:
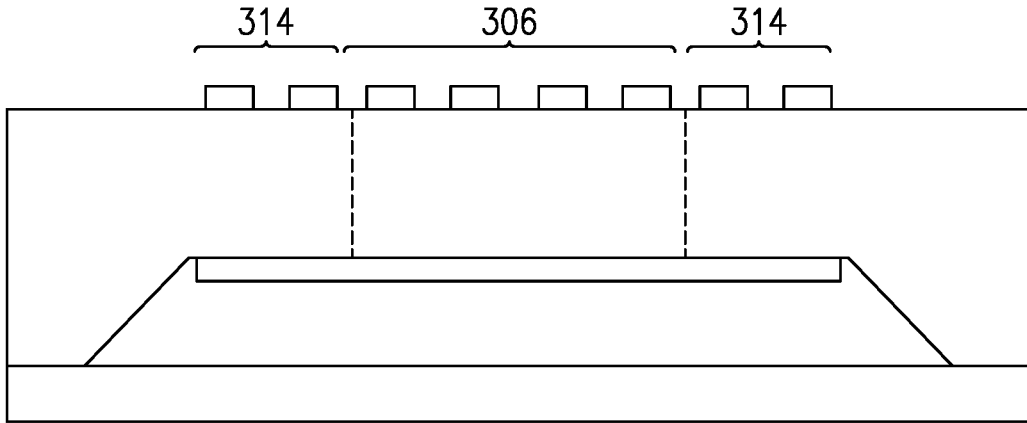
FIGS. 10C-10G are cross-sectional diagrams of other examples of Lamb wave resonators.

In some embodiments, the IDT electrode 306 may be include a plurality of interdigitated electrode fingers 310A. 310B extending from respective bus bar electrodes 312A, 312B and disposed between reflector gratings 314 including reflector fingers 316 and reflector bus bars 318, as illustrated in plan view in FIG. 10B and cross-sectional view in FIG. 10C.

Figure 10D:
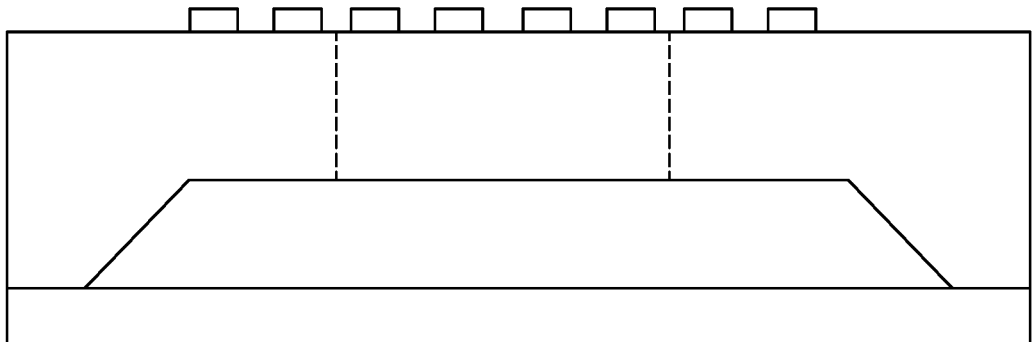
Figure 10E:
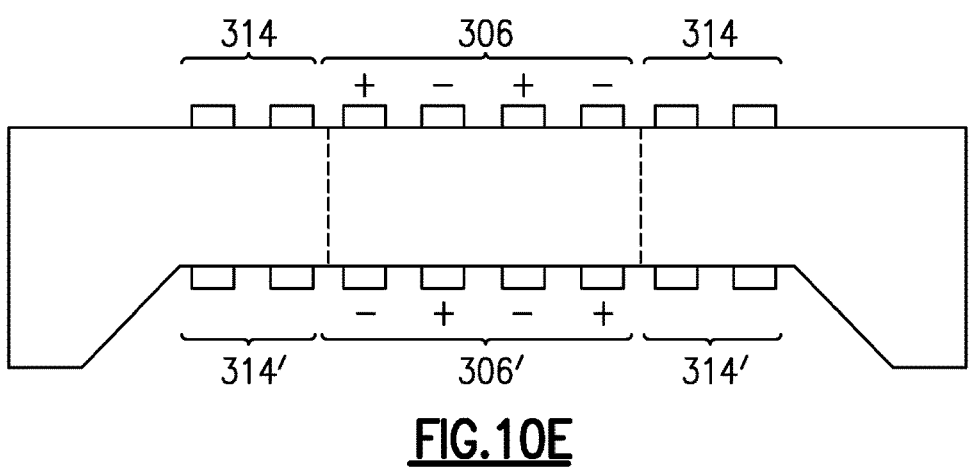

Another example of a Lamb waver resonator is illustrated in cross-section in FIG. 10D. The Lamb wave resonator of FIG. 10D differs from that illustrated in FIG. 10C in that the lower electrode 307 is omitted.

Figure 10F:
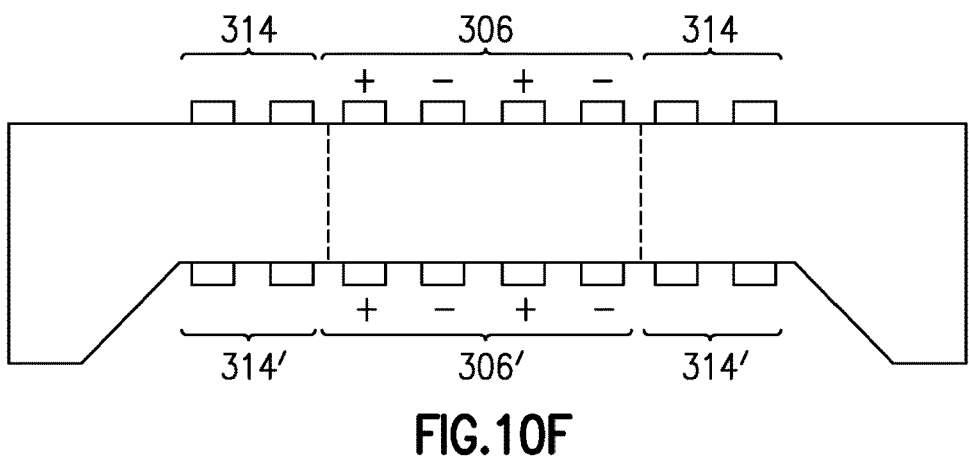
Figure 10G:
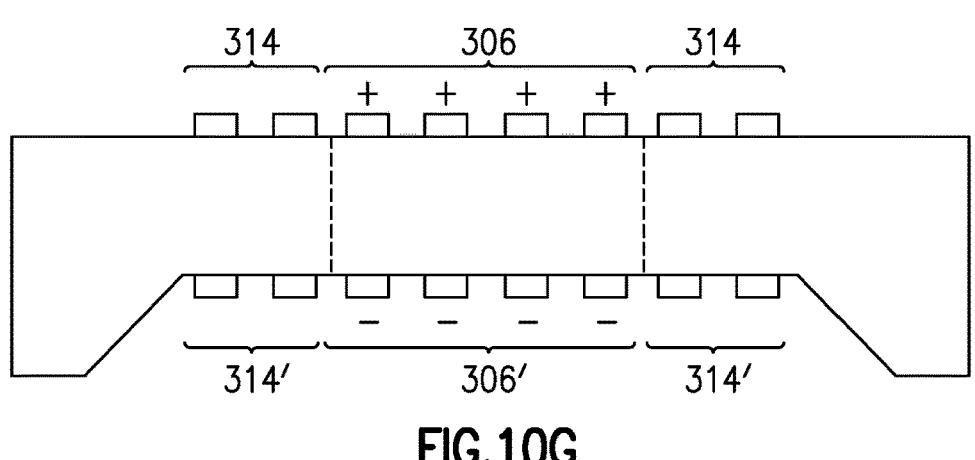

In other embodiments, the lower electrode 307 may be replaced with a lower IDT electrode 306' and associated reflector gratings 314'. The upper and lower IDT electrodes 306, 306' may include fingers 310 to which the same voltage polarity is applied during operation that are either horizontally offset from one another (FIG. 10E) or vertically aligned with one another (FIG. 10F). In other embodiments an opposite voltage polarity may be applied to each of the fingers of the upper IDT electrode 306 than the voltage polarity applied to each of the fingers of the lower IDT electrode 306' during operation (FIG. 10G). The substrates 309 are omitted from FIGS. 10E-10G for clarity.

Figure 3B:
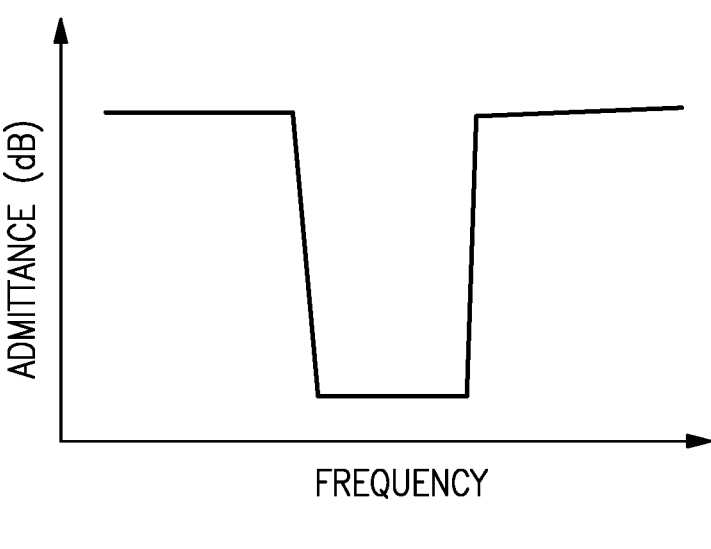
FIG. 3B is a simplified illustration of the shape of an admittance versus frequency curve for an example of a notch filter.

A notch filter formed of Lamb wave resonators as described herein may exhibit similar admittance vs. frequency characteristics as a notch filter formed of BAWs, for example, as illustrated in FIG. 3B above.

Figure 11:
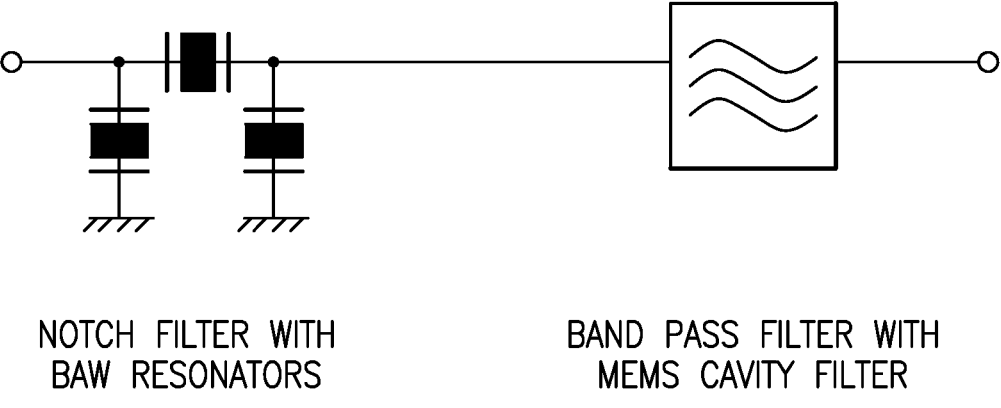
FIG. 11 is a schematic diagram of a combination filter including a BAW notch filter and a MEMS cavity filter in series.

In some embodiments, different forms of filters are combined to form a combination filter having the advantages of each of the different forms of filters. In one example, a notch filter formed of bulk acoustic wave resonators, for example, BAWs or Lamb wave resonators as disclosed herein may be arranged electrically in series with a MEMS cavity filter to form a combination filter as illustrated in FIG. 11. Such a combination filter may provide benefits associated with both a filter formed from bulk acoustic wave resonators (BAWs) and a MEMS cavity filter.

Figure 12A:
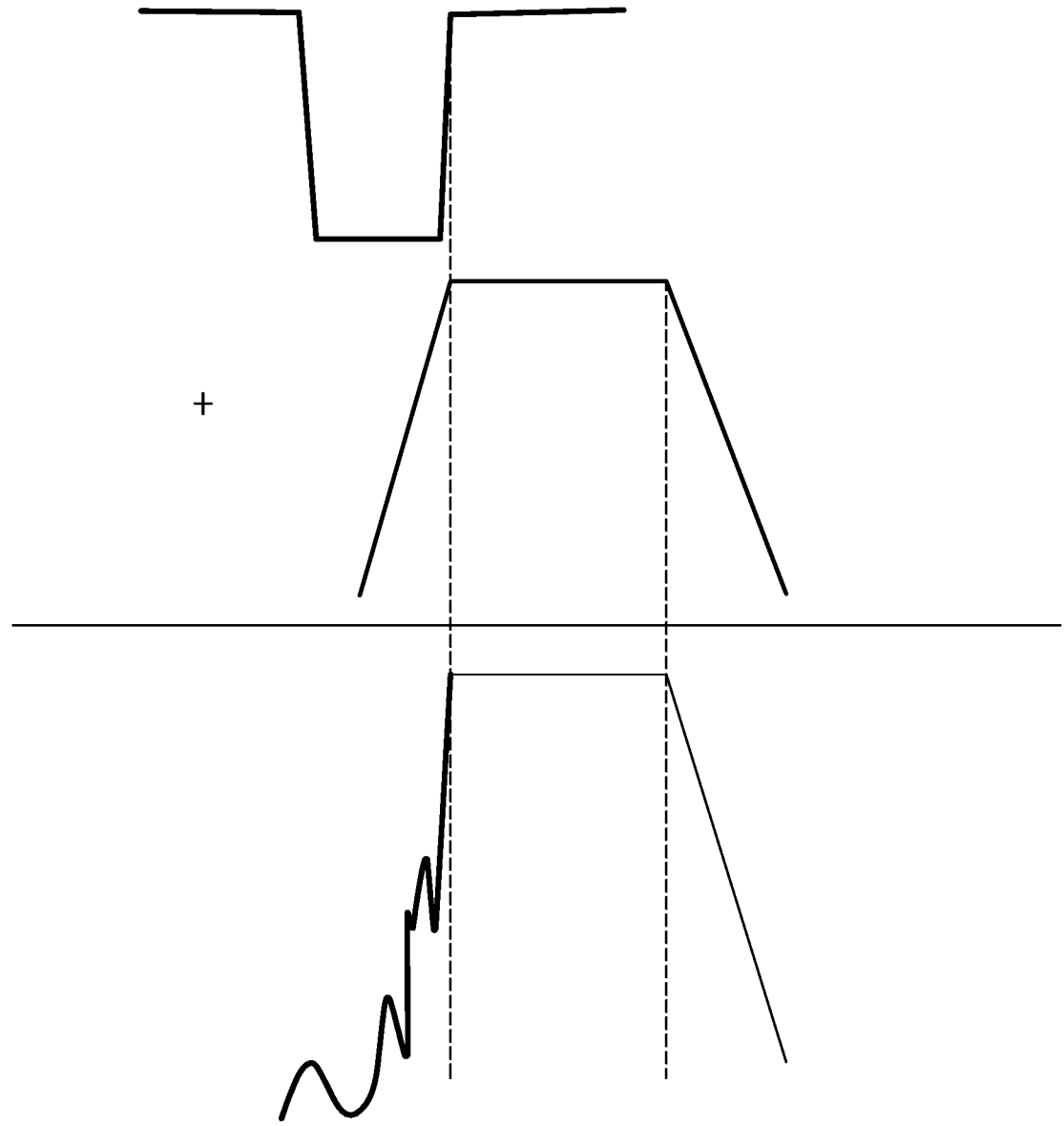
FIG. 12A illustrates one way the frequency responses of the BAW notch filter and the MEMS cavity filter of the combination filter of FIG. 11 may be combined to define a frequency response for the combination filter.
Figure 12B:
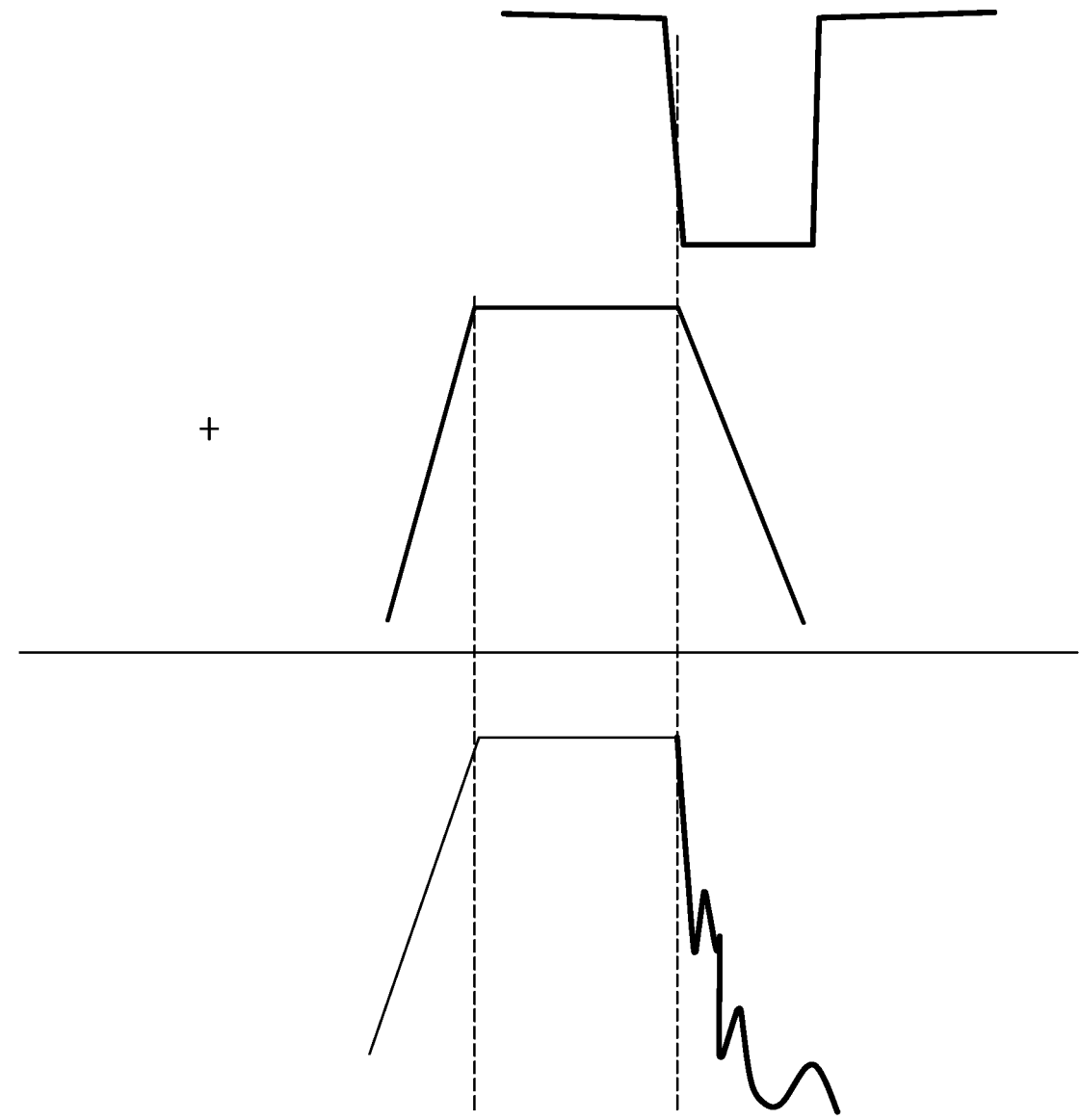
FIG. 12B illustrates another way the frequency responses of the BAW notch filter and the MEMS cavity filter of the combination filter of FIG. 11 may be combined to define a frequency response for the combination filter.
Figure 12C:
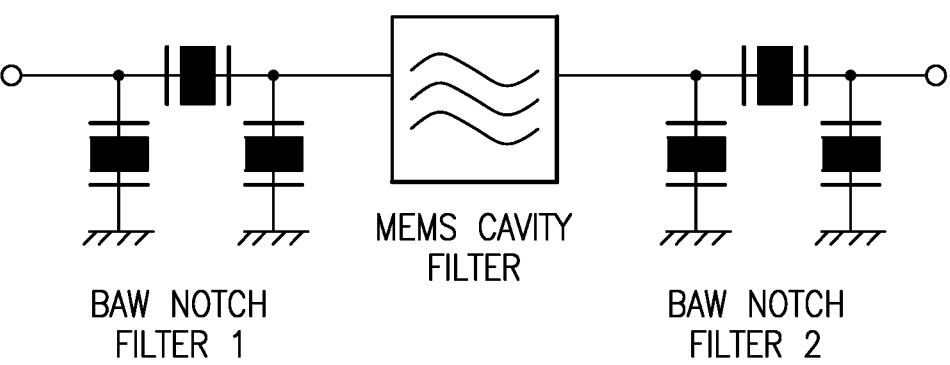
FIG. 12C is a schematic diagram of a combination filter including two BAW notch filters and a MEMS cavity filter in series.
Figure 12D:
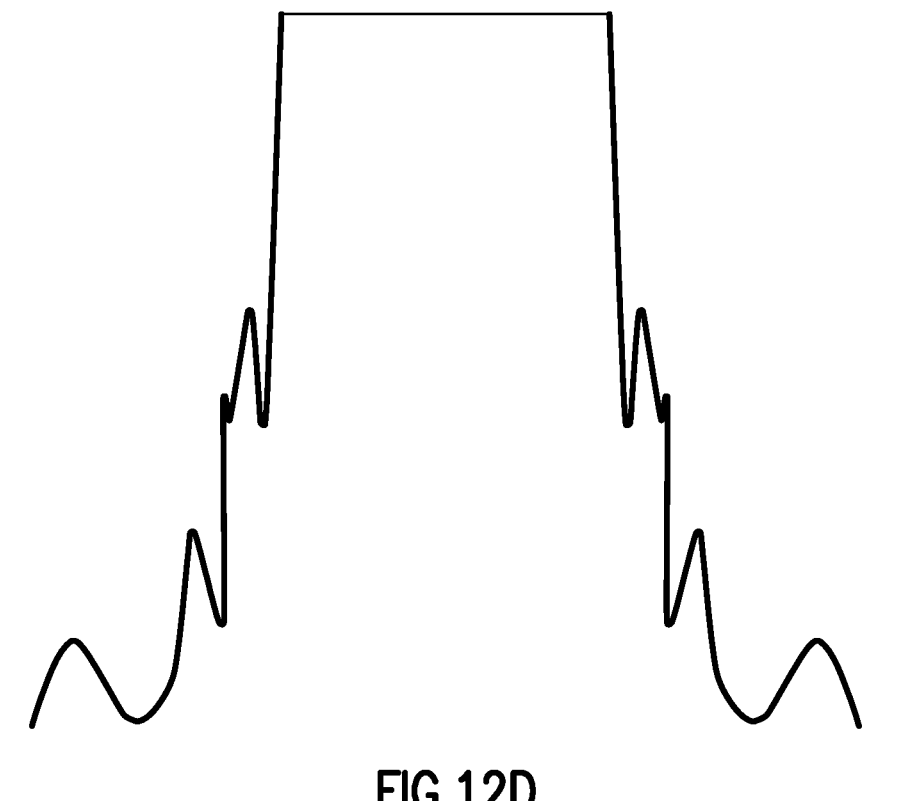
FIG. 12D illustrates a frequency response for the combination filter of FIG. 12C.

As discussed above, the stop band for a BAW notch filter has steep skirts while a MEMS cavity filter may have a wide skirt. If one were to combine a BAW notch filter and a MEMS cavity filter in series as illustrated in FIG. 11 and select BAW resonators for the notch filter and a cavity filter such that the upper edge of the stop band of the BAW notch filter aligned with the lower end passband of the cavity filter, one could obtain a combination filter with a steeper lower skirt than exhibited by the cavity filter alone. This is illustrated schematically in FIG. 12A. Similarly, if one were to combine a BAW notch filter and a MEMS cavity filter in series as illustrated in FIG. 11 and select BAW resonators for the notch filter and a cavity filter such that the lower edge of the stop band of the BAW notch filter aligned with the upper end of the passband of the cavity filter, one could obtain a combination filter with a steeper upper skirt than exhibited the cavity filter alone. This is illustrated schematically in FIG. 12B. If one used two notch filters in series with a cavity filter as illustrated in FIG. 12C, selected BAW resonators for one notch filter such that the upper edge of the stop band of the BAW notch filter aligned with the lower end passband of the cavity filter, and selected BAW resonators for the other notch filter such that the lower edge of the stop band of the other BAW notch filter aligned with the upper end passband of the cavity filter, one could obtain a combination filter combining the effects illustrated in FIGS. 12A and 12B with a passband with sharp upper and lower skirts as illustrated schematically in FIG. 12D. The cavity filter may be disposed between the two notch filters as illustrated. It should be understood that either terminal of embodiments of the combined filter may be the input and the other terminal the output.

A combination filter as disclosed herein exhibits advantages of both BAW filters and MEMS cavity filters while avoiding at least some of the disadvantages of each type of filter. The cavity filter is responsible for defining the passband of the combination filter and can operate with high power within this passband. The BAW filters, which are often less capable of handling the same amount of power as a cavity filter, are arranged in notch filter configurations and help define the skirts of the combined filter and thus do not need to handle high amounts of power. The cavity filter can operate at high frequencies, as can the BAW filters when operated in overtone mode.

Figure 13:
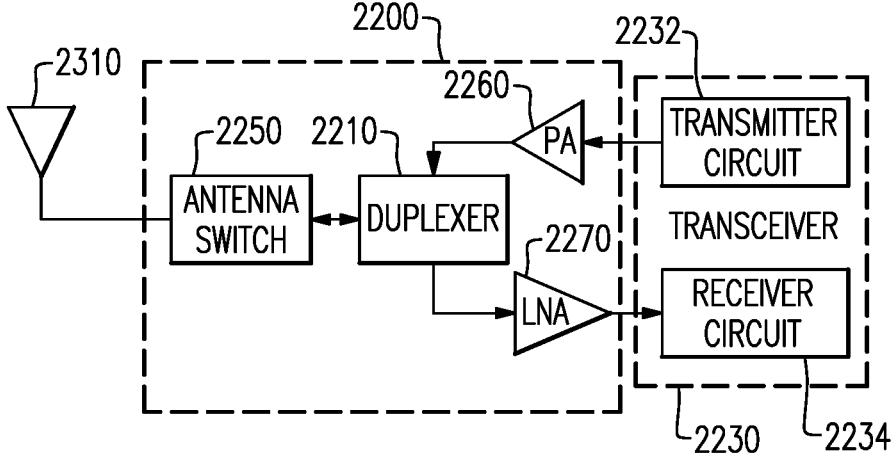
FIG. 13 is a schematic of a radio frequency front end module incorporating aspects disclosed herein.

Combination filters as disclosed herein including both BAW or Lamb wave notch filters and MEMS cavity filters may be incorporated into a radio-frequency front end (RFFE) module. An exemplary RFFE module is shown in FIG. 13. This figure illustrates a front end module 2200, connected between an antenna 2310 and a transceiver 2230. The front end module 2200 includes a duplexer 2210 in communication with an antenna switch 2250, which itself is in communication with the antenna 2310.

As illustrated, the transceiver 2230 comprises a transmitter circuit 2232. Signals generated for transmission by the transmitter circuit 2232 are received by a power amplifier (PA) module 2260 within the front end module 220 which amplifies the generated signals from the transceiver 2230. The PA module 2260 can include one or more PAs. The PA module 2260 can be used to amplify a wide variety of RF or other frequency-band transmission signals. For example, the PA module 2260 can receive an enable signal that can be used to pulse the output of the PE to aid in transmitting a wireless local area network (WLAN) signal or any other suitable pulsed signal. The PA module 2260 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the PA module 2260 and associated components including switches and the like can be fabricated on gallium arsenide (GaAs) substrates using, for example, high electron mobility transistors (pHEMT) or insulated-gate bipolar transistors (BiFET), or on a silicon substrate using complementary metal-oxide semiconductor (CMOS) field effect transistors (FETs).

Still referring to FIG. 13, the front end module 2200 may further include a low noise amplifier (LNA) module 2270, which amplifies received signals from the antenna 2310 and provides the amplified signals to the receiver circuit 2234 of the transceiver 2230.

Figure 14:
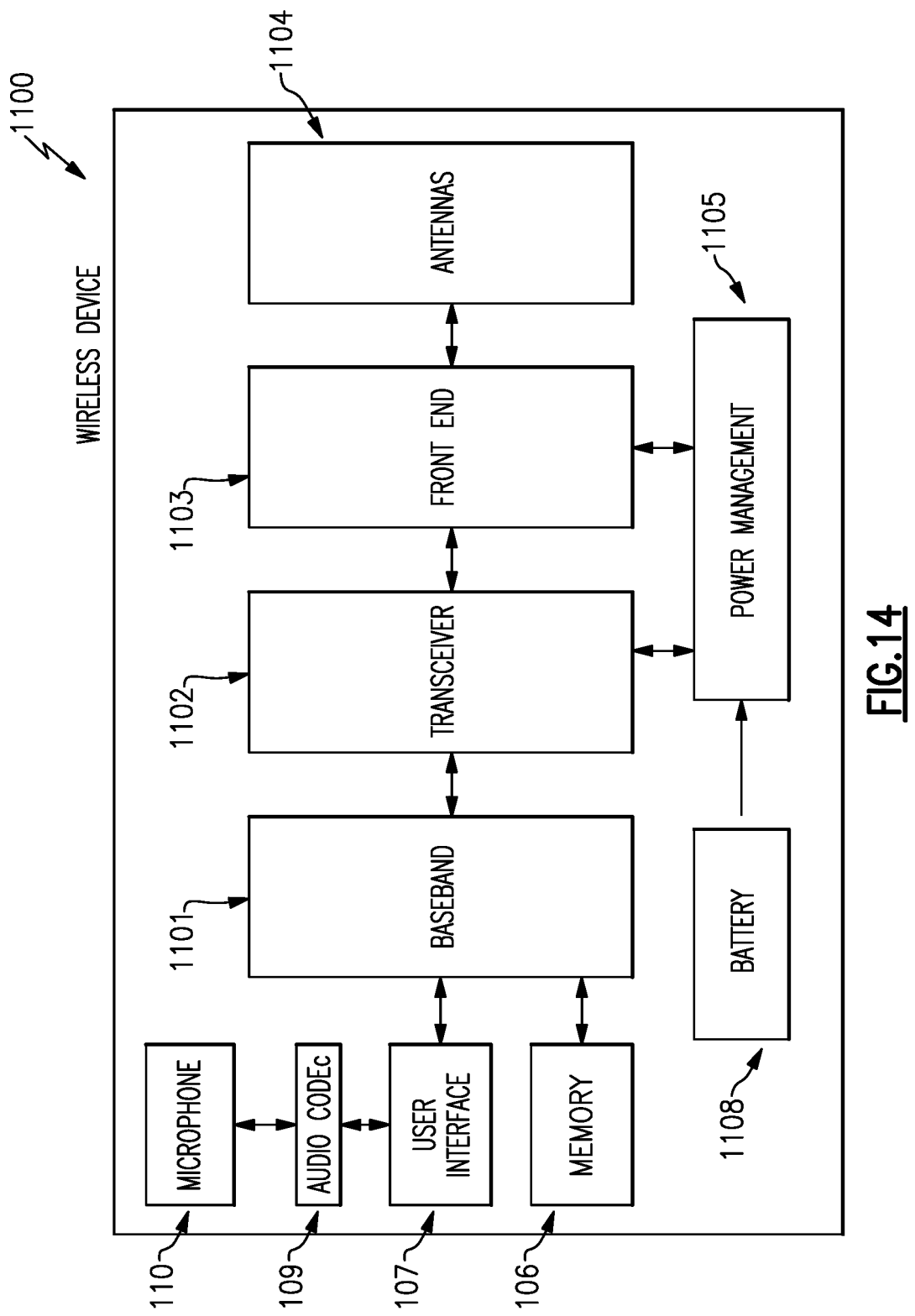
FIG. 14 is a schematic of a wireless device incorporating aspects disclosed herein.

FIG. 14 is a schematic diagram of a wireless device 1100 that can incorporate aspects of combination filters as disclosed herein. The wireless device 1100 can be, for example but not limited to, a portable telecommunication device such as, a mobile cellular-type telephone. The wireless device 1100 can include a microphone arrangement 1100, and may include one or more of a baseband system 1101, a transceiver 1102, a front end system 1103, one or more antennas 1104, a power management system 1105, a memory 1106, a user interface 1107, a battery 1108, and audio codec 1109. The microphone arrangement may supply signals to the audio codec 109 which may encode analog audio as digital signals or decode digital signals to analog. The audio codec 1109 may transmit the signals to a user interface 1107. The user interface 1107 transmits signals to the baseband system 1101. The transceiver 1102 generates RF signals for transmission and processes incoming RF signals received from the antennas. The front end system 1103 aids in conditioning signals transmitted to and/or received from the antennas 1104. The antennas 1104 can include antennas used for a wide variety of types of communications. For example, the antennas 1104 can include antennas 1104 for transmitting and/or receiving signals associated with a wide variety of frequencies and communications standards. The baseband system 1101 is coupled to the user interface to facilitate processing of various user input and output, such as voice and data. The baseband system 1101 provides the transceiver 1102 with digital representations of transmit signals, which the transceiver 1102 processes to generate RF signals for transmission. The baseband system 1101 also processes digital representations of received signals provided by the transceiver 1102.

As shown in FIG. 14, the baseband system 1101 is coupled to the memory 1106 to facilitate operation of the wireless device 1100. The memory 1106 can be used for a wide variety of purposes, such as storing data and/or instructions to facilitate the operation of the wireless device 1100 and/or to provide storage of user information. The power management system 1105 provides a number of power management functions of the wireless device 1100. The power management system 1105 receives a battery voltage from the battery 1108. The battery 1108 can be any suitable battery for use in the wireless device, including, for example, a lithium-ion battery.

Embodiments of the combination filters described herein may be incorporated into the wireless device 1100 of FIG. 14, in particular may be incorporated into the front end system 1103

It should be appreciated that the resonators illustrated herein along with other structures illustrated in the other figures accompanying this disclosure, are illustrated in a highly simplified form. The relative dimensions of the different features are not shown to scale. Further, embodiments comprising elements of the resonators, filters, combined filters, or devices disclosed herein may include additional features or layers not illustrated or may lack one or more features or layers illustrated herein.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A combination filter comprising:
   a notch filter formed of acoustic wave resonators and having a non-tunable stopband; and
   a cavity filter electrically in series with the notch filter to provide for the combination filter to operate at higher powers and frequencies.

2. The combination filter of claim 1 wherein the notch filter is formed of bulk acoustic wave resonators.

3. The combination filter of claim 2 wherein the bulk acoustic wave resonators include piezoelectric films having multiple sub-layers having different crystallographic orientations that provide for the bulk acoustic wave resonators to operate in one of a second overtone mode or a third overtone mode.

4. The combination filter of claim 3 wherein the bulk acoustic wave resonators include piezoelectric films having two sub-layers having different crystallographic orientations.

5. The combination filter of claim 3 wherein the bulk acoustic wave resonators include piezoelectric films having four sub-layers, adjacent ones of the four sub-layers having different crystallographic orientations.

6. The combination filter of claim 3 wherein the bulk acoustic wave resonators include piezoelectric films having multiple sub-layers having different crystallographic orientations that provide for the bulk acoustic wave resonators to operate in the third overtone mode.

7. The combination filter of claim 1 wherein the notch filter is formed of lamb wave resonators.

8. The combination filter of claim 7 wherein the cavity filter is a microelectromechanical system cavity filter.

9. The combination filter of claim 1 wherein an upper end of the non-tunable stopband of the notch filter is aligned with a lower end of a passband of the cavity filter.

10. The combination filter of claim 1 wherein a lower end of the non-tunable stopband of the notch filter is aligned with an upper end of a passband of the cavity filter.

11. The combination filter of claim 1 wherein the notch filter is a first notch filter and the combination filter further comprises a second notch filter having a non-tunable stopband in series with the first notch filter and cavity filter.

12. The combination filter of claim 11 wherein an upper end of the non-tunable stopband of the first notch filter is aligned with a lower end of a passband of the cavity filter and a lower end of the non-tunable stopband of the second notch filter is aligned with an upper end of the passband of the cavity filter.

13. The combination filter of claim 1 having an operating frequency between about 0.4 and about 7.1 GHz.

14. The combination filter of claim 1 having an operating frequency between about 24 GHz and about 53 GHz.

15. The combination filter of claim 1 exhibiting a steeper skirt than the cavity filter alone.

16. The combination filter of claim 1 exhibiting a greater power handling ability at a given frequency than a ladder filter formed of acoustic wave resonators operating at the given frequency.

17. A radio frequency front end module including the combination filter of claim 1.

18. The radio frequency front end module of claim 17 having an operating frequency within one of the 5G FR1 band or the 5G FR2 band.

19. An electronic device including the radio frequency front end module of claim 18.

20. The combination filter of claim 1 wherein the notch filter includes a lamb wave resonator having a layer of piezoelectric material disposed over a cavity and interdigital transducer electrodes disposed on both upper and lower surfaces of the layer of piezoelectric material.

\* \* \* \* \*